United States Patent
Sakamoto

(10) Patent No.: US 10,270,408 B2
(45) Date of Patent: Apr. 23, 2019

(54) SEMICONDUCTOR DEVICE

(71) Applicant: Renesas Electronics Corporation, Tokyo (JP)

(72) Inventor: Shingo Sakamoto, Tokyo (JP)

(73) Assignee: RENESA ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/730,953

(22) Filed: Oct. 12, 2017

(65) Prior Publication Data
US 2018/0109233 A1 Apr. 19, 2018

(30) Foreign Application Priority Data

Oct. 14, 2016 (JP) .................. 2016-202221

(51) Int. Cl.
H03F 3/04 (2006.01)
H03G 3/00 (2006.01)
H03F 1/02 (2006.01)
H03F 3/30 (2006.01)
H03F 3/213 (2006.01)
(Continued)

(52) U.S. Cl.
CPC .............. H03G 3/007 (2013.01); G05F 1/10 (2013.01); H03F 1/0227 (2013.01); H03F 1/0238 (2013.01); H03F 1/0255 (2013.01); H03F 1/30 (2013.01); H03F 3/213 (2013.01); H03F 3/245 (2013.01); H03F 3/3022 (2013.01); H03F 3/45475 (2013.01); H03G 1/0023 (2013.01); H03G 1/0029 (2013.01); H03G 1/0035 (2013.01); H03G 3/3042 (2013.01); *H03F 2200/321* (2013.01); *H03F 2200/447* (2013.01);
(Continued)

(58) Field of Classification Search
CPC .... H03G 3/007; H03G 1/0023; H03G 1/0029; H03G 1/0035; H03G 3/3042; H03F 3/245; H03F 1/0238; H03F 1/0255; H03F 1/30; H03F 3/45475; H03F 3/213; H03F 1/0227; H03F 3/3022; H03F 2200/321; H03F 2200/447; H03F 2203/45528; H03F 2201/3215; G05F 1/10
See application file for complete search history.

(56) References Cited

U.S. PATENT DOCUMENTS 7,109,791 B1* 9/2006 Epperson .............. H03F 1/0211
327/309
8,531,240 B2* 9/2013 Ubbesen .............. H03G 3/3047
330/127

(Continued)

FOREIGN PATENT DOCUMENTS

JP 2003-271251 A 9/2003
JP 2006-155501 A 6/2006

*Primary Examiner* — Khanh V Nguyen
(74) *Attorney, Agent, or Firm* — McDermott Will & Emery LLP

(57) ABSTRACT

Use of a closed loop APC may involve a problem of cost and power consumption due to increased circuit scale.
The semiconductor device includes a power amplifier that amplifies an output from a transmission circuit and a regulator that supplies power to the power amplifier. The regulator includes an operational amplifier comprising a loop gain control circuit and a loop gain control voltage generation circuit that supplies control voltage to the loop gain control circuit. The loop gain control voltage generation circuit minimizes a loop gain of the operational amplifier when starting up the regulator.

20 Claims, 8 Drawing Sheets

(51) Int. Cl.
- *H03G 1/00* (2006.01)
- *H03G 3/30* (2006.01)
- *G05F 1/10* (2006.01)
- *H03F 1/30* (2006.01)
- *H03F 3/24* (2006.01)
- *H03F 3/45* (2006.01)

(52) U.S. Cl.
CPC ............... *H03F 2201/3215* (2013.01); *H03F 2203/45528* (2013.01)

(56) References Cited

U.S. PATENT DOCUMENTS 9,595,933 B2 * 3/2017 Zhao .................... H03G 3/3042
9,685,911 B2 * 6/2017 Tsutsui .................. H03F 1/0211

* cited by examiner

SEMICONDUCTOR DEVICE

CROSS-REFERENCE TO RELATED APPLICATIONS

The disclosure of Japanese Patent Application No. 2016-202221 filed on Oct. 14, 2016 including the specification, drawings and abstract is incorporated herein by reference in its entirety.

BACKGROUND

The present invention relates to a semiconductor device, which can be applied to, for example, a semiconductor device incorporating a power amplifier.

In a specific power-saving wireless system such as Bluetooth and Wi-SUN (Wireless Smart Utility Network), transmission power is generally controlled in an open loop due to the low transmission power. In such systems, an absolute value of the transmission power is so small that there is no problem with a spurious wave in a near band of a transmitted signal frequency.

SUMMARY

Recently, however, use of a high-power system is taken into account, and it is necessary to address the spurious problem. Although the problem can be addressed by introducing a closed-loop APC (Automatic Power Control) into these systems as in the GSM, another problem will arise in terms of increased cost and power consumption caused by increased circuit scale due to additional wave detector, integrator, or the like.

Other problems and novel features will be apparent from the description herein and appended drawings.

An outline representative of the present disclosure is be concisely described as below.

The semiconductor device includes a regulator for a power amplifier, which controls a rise rate of an output voltage of the regulator.

The semiconductor device described above can suppress the increase of the circuit scale.

DETAILED DESCRIPTION

Hereinbelow, embodiments and implementations will be described with reference to drawings. It should be noted, however, that like components are denoted by like numerals and the explanation thereof may not be repeated.

When raising an output level of a power amplifier to start transmission at the time of transmission output from a wireless unit, the transmission output signal receives an amplifier modulation and thus a spurious wave may occur in a near band of a transmitted signal frequency, which may affect a system using an adjacent channel. The shorter the rise time of the output from the power amplifier and the steeper the rise is, the wider the band in which the spurious wave may occur.

Thus, the wireless unit that is a semiconductor device according to the present embodiment is configured to include a regulator specifically for the power amplifier, thereby controlling the rise rate of the output voltage from the regulator. Specifically, the semiconductor device limits an inrush current upon start-up of the regulator, thereby extending time for charging to a capacitor coupled to the output. More specifically, the semiconductor device includes a transmission circuit, a power amplifier that amplifies a signal from the transmission circuit, and a regulator that supplies power to the power amplifier, and controls a loop gain of an operational amplifier of the regulator to gradually increase at the time of starting the transmission.

By controlling the loop gain of the operational amplifier to gradually increase, it is possible to slowly raise the output voltage from the regulator and thus to make the rise rate of the power amplifier gentler. The spurious wave generated by the power amplifier can be reduced because the power supply voltage for the power amplifier rises gradually. In this manner, the spurious wave can be suppressed without using the APC, which can suppress the increase of the cost and power consumption caused by increased circuit scale.

(Implementation)

Figure 1:
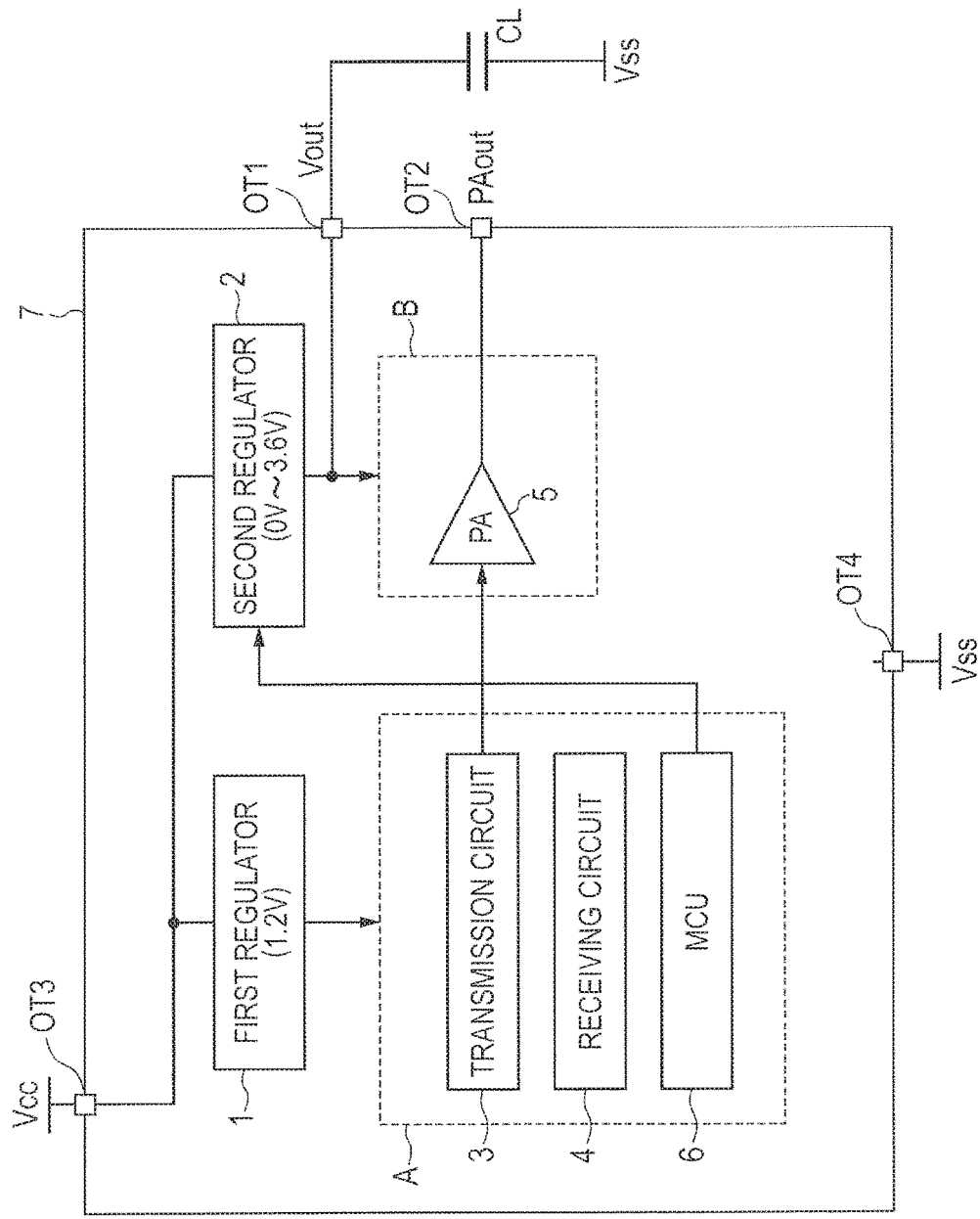
FIG. 1 is a block diagram showing a configuration of a wireless unit according to an embodiment.

The wireless unit according to the implementation is described with reference to FIG. 1. FIG. 1 is a block diagram showing a configuration of the wireless unit according to the implementation. The wireless unit 7 according to the implementation controls a transmission output power using a power supply voltage of the regulator combined with the power amplifier. The wireless unit 7 is a semiconductor device that includes a first circuit block A including a first regulator 1, a second regulator 2, a transmission circuit 3, a receiving circuit 4, and an MCU (Micro Control Unit) 6 serving as a control circuit, and a second circuit block B including a power amplifier 5 on a single semiconductor chip. The wireless unit 7 also includes an external terminal OT1 for coupling a load capacitor CL to an output of the second regulator 2, an external terminal OT2 for outputting an output of the power amplifier 5 (PAout) to the outside, an external terminal OT3 for inputting an external power supply voltage (Vcc), and an external terminal OT4 for inputting a reference potential (Vss). Supplied to the first circuit block A is the process-standard voltage (for example, about 1.2 V) from the first regulator 1, and to the second circuit block B is the power supply voltage from the second regulator 2, which can be set at, for example, 0 V to 3 V or higher. The MCU 6 may also include a CPU (Central Processing Unit), a memory that stores therein a program to be executed by the CPU and data, and the like.

In general, the power amplifier can be advantageous for reduction of power consumption at the time of transmission by supplying a high power supply voltage only to the power amplifier because the power efficiency can easily be increased with higher power supply voltage. Therefore, there is the second regulator 2 provided to supply the power amplifier 5 with the high power supply voltage. In this configuration, the voltage of the second regulator 2 is set at 0 V when the transmission is stopped. By slowly changing the voltage of the second regulator 2 from 0 V to the power supply voltage to reach the required transmission power, the change of the envelope (envelope curve) can be made gentler, thereby suppressing the near band spurious.

Figure 2:
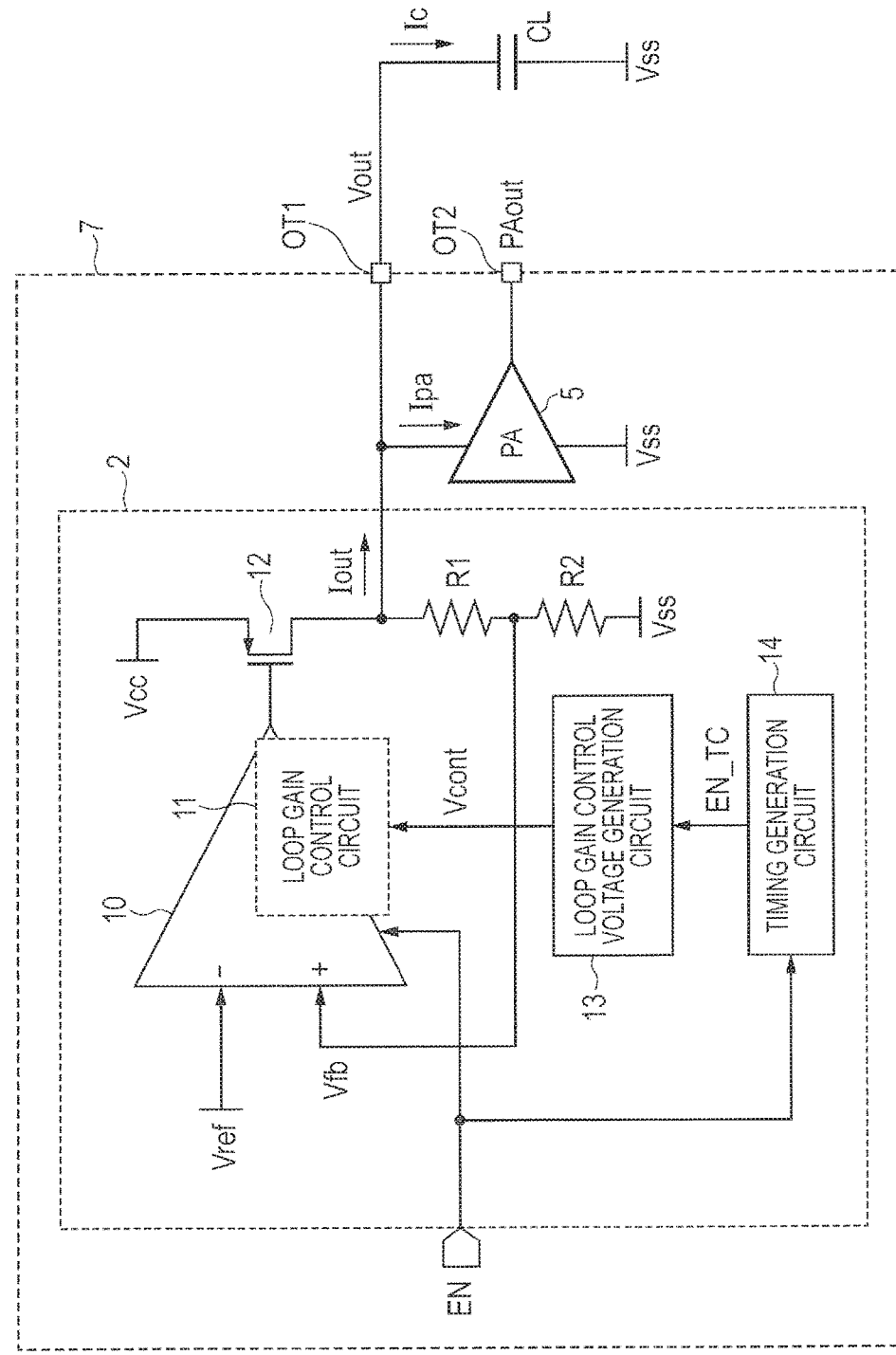
FIG. 2 shows a configuration of a second regulator shown in FIG. 1.

The second regulator 2 is now described below with reference to FIG. 2. FIG. 2 shows a configuration of the second regulator shown in FIG. 1. The second regulator 2 includes an operational amplifier 10 including a loop gain control circuit 11 that controls a loop gain based on voltage control, a PMOS transistor 12, resistors R1, R2 that divide output voltages, a loop gain control voltage generation circuit 13 that slowly changes the loop gain, and a timing generation circuit 14 that generates a timing signal operating the loop gain control voltage generation circuit. A partial voltage (Vfb) of the output voltage (Vout) is input to a non-inverting input terminal (+input terminal) of the operational amplifier, and a reference voltage (Vref) is input to an inverting input terminal (−input terminal). The second regulator 2 operates when a first enable signal (EN) becomes high (H) to output a current (Iout) to the power amplifier 5 and the external terminal OT1. The first enable signal (EN) is supplied by the MCU 6.

The inrush current when starting up the second regulator 2 can be restrained by limiting the loop gain of the regulator to be low. When starting up the second regulator 2, the loop gain of the second regulator 2 can be minimized by controlling the loop gain control voltage (Vcont) that is an output from the loop gain control voltage generation circuit 13 so that the loop gain may be low. This limits the inrush current of the second regulator 2 to be low, and thus the output voltage (Vout) slowly increases as the load capacitor CL coupled to the output of the second regulator 2 is charged. Because the load capacitor CL can be used, it is possible to easily make a large time constant at the rise time.

At a certain timing at which the increase of the output voltage (Vout) starts to slow down, the timing generation circuit 14 outputs a second enable signal (EN_TC) that operates the loop gain control voltage generation circuit 13, the loop gain control voltage generation circuit 13 outputs the loop gain control voltage (Vcont) that decreases at a certain gradient, and the voltage is input to the loop gain control circuit 11 in the operational amplifier 10. In this manner, by continuously increasing the loop gain of the second regulator 2 based on analog control, the output current (Iout) of the second regulator 2 can be controlled to slowly increase, and thus the output voltage (Vout) continuously changes to converge to an expected value.

Figure 3:
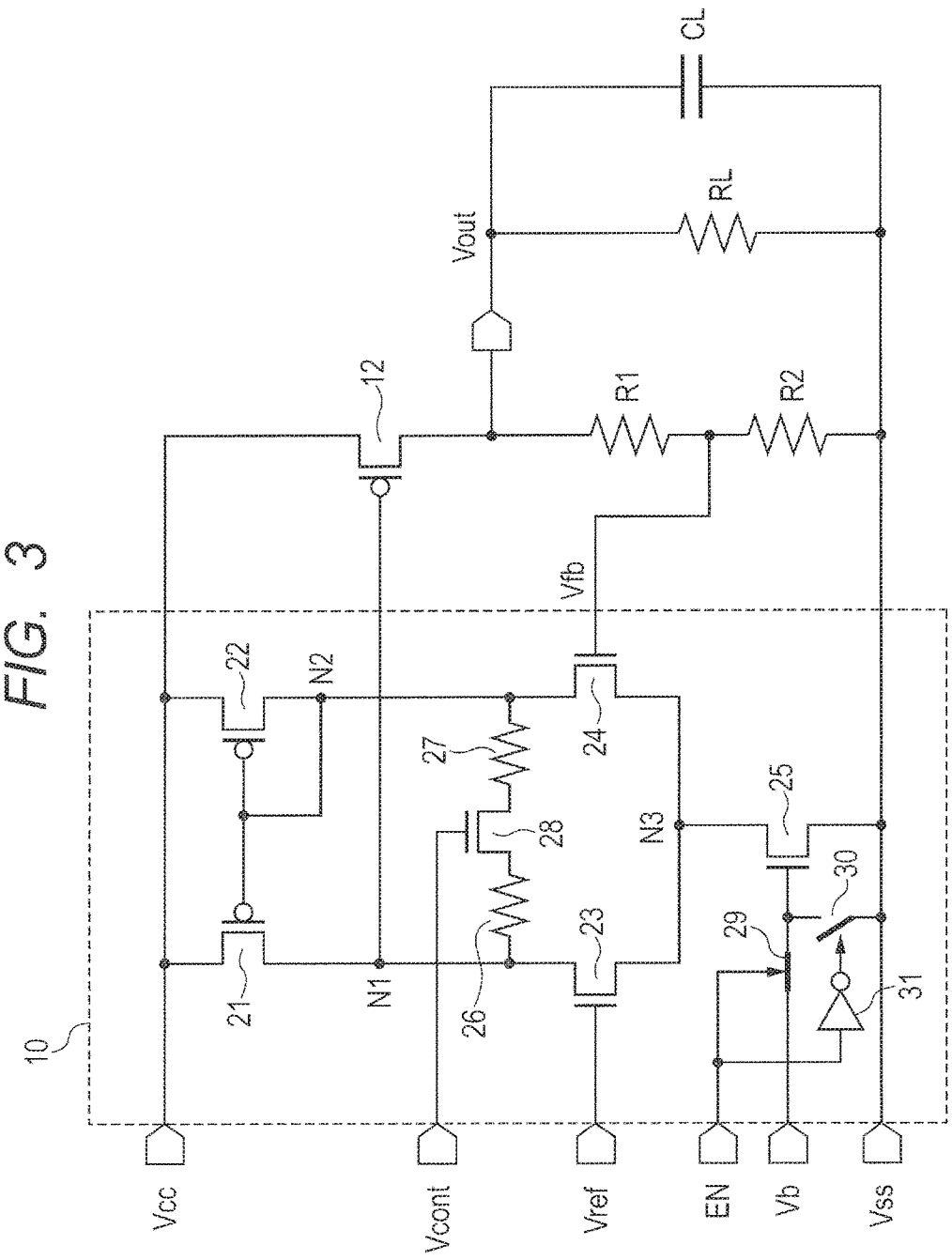
FIG. 3 is a circuit diagram showing an operational amplifier shown in FIG. 2 and its peripheral circuit.

The operational amplifier 10 having a loop gain control function shown in FIG. 2 is now described with reference to FIG. 3. FIG. 3 is a circuit diagram showing the operational amplifier 10 shown in FIG. 2 and its peripheral circuit. In FIG. 3, the power amplifier 5 is indicated by an equivalent load resistor RL.

The operational amplifier 10 includes PMOS transistors 21, 22 that configure an active load in a current mirror, NMOS transistors 23, 24 that configure a differential pair, and an NMOS transistor 25 that configures a current source. A gate terminal of the NMOS transistor 23 is the inverting input terminal, to which the reference voltage (Vref) is input. A gate terminal of the NMOS transistor 24 is the non-inverting input terminal, to which the voltage (Vfb) is input. Input to a gate terminal of the NMOS transistor 25 is the bias voltage (Vb).

The operational amplifier 10 also includes resistors 26, 27 and an NMOS transistor 28 coupled between a node N1 and a node N2 (between differential outputs), and switches (SW) 29, 30 and an inverter 31 that control the gate of the NMOS transistor 25.

It should be noted that, although the reference potential (Vref) and the bias voltage (Vb) are generated outside the second regulator 2 herein, they may be generated inside the second regulator 2. SWs 29, 30 may be configured by, for example, a transfer gate to which the NMOS transistor and the PMOS transistor are coupled in parallel.

When the first enable signal (EN) is H, SW 29 is turned ON and SW 30 is turned OFF, which turns the NMOS transistor 25 operating as a tail current source ON. The enable signal (EN) is supplied by the MCU 6.

When starting up the second regulator 2, the loop gain control voltage (Vcont) becomes H and the NMOS transistor 28 is turned ON, whereby a resistor R26 and a resistor R27 between the differential outputs of the operational amplifier 10 are coupled to each other, resulting in a low open gain of the operational amplifier 10. This makes it possible to keep the loop gain of the second regulator 2 lower. The NMOS transistor 28 operates as a variable resistor and configures the loop gain control circuit 11.

Figure 4:
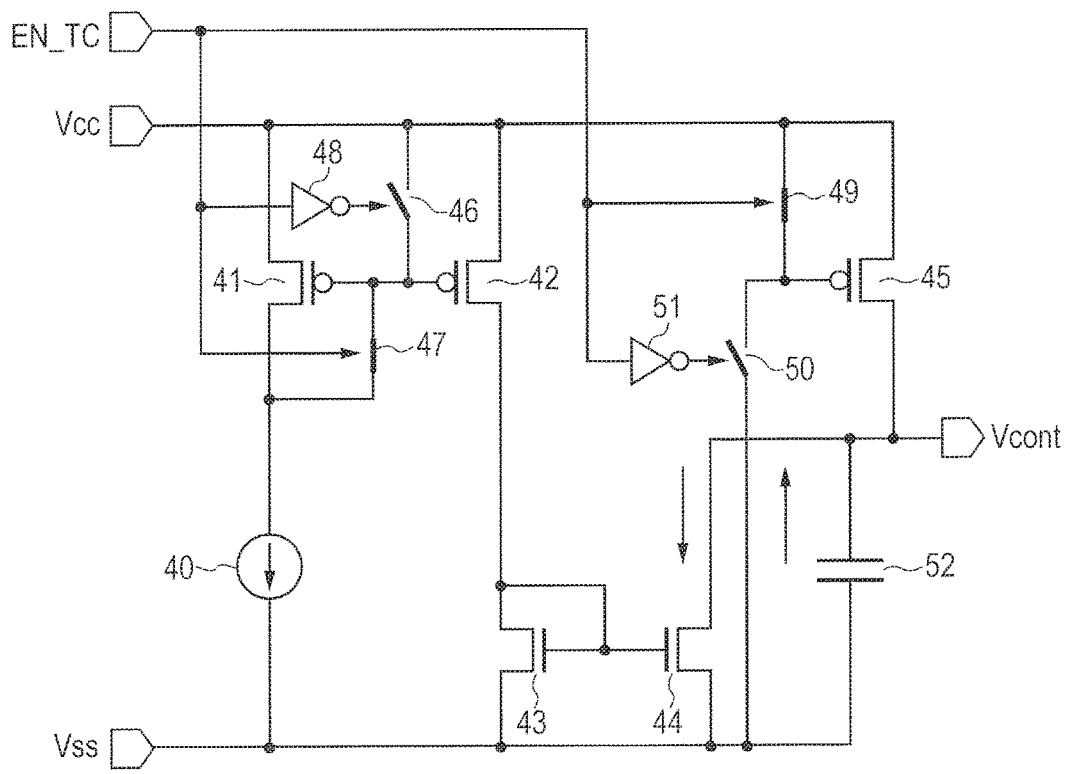
FIG. 4 is a circuit diagram showing a loop gain control voltage generation circuit shown in FIG. 2.

The loop gain control voltage generation circuit shown in FIG. 2 is now described with reference to FIG. 4. FIG. 4 is a circuit diagram showing the loop gain control voltage generation circuit shown in FIG. 2. When the second enable signal (EN_TC) is low (L), an output from an inverter 48 becomes H, SW 46 is turned ON, SW 47 is turned OFF, and thus PMOS transistors 41, 42, and NMOS transistors 43, 44 that configure a current mirror circuit are turned OFF. Furthermore, SW 49 is turned OFF, an output of an inverter 51 becomes H, SW 50 is turned ON, a PMOS transistor 45 for capacity charge is turned ON, a capacitor 52 is then charged and the loop gain control voltage (Vcont) becomes the power supply voltage (Vcc).

When the second enable signal (EN_TC) becomes H, SW 49 is turned ON, SW 50 is turned OFF, and the PMOS transistor 45 for capacity charge is turned OFF. SW 46 is turned OFF, SW 47 is turned ON, the current mirror circuit is turned ON, the charges in the capacitor 52 are discharged from the NMOS transistor 44, and thus the loop gain control voltage (Vcont) reduces at a certain gradient. This enables the loop gain control voltage generation circuit 13 to generate the loop gain control voltage in which the output voltage gradually decreases.

Figure 5:
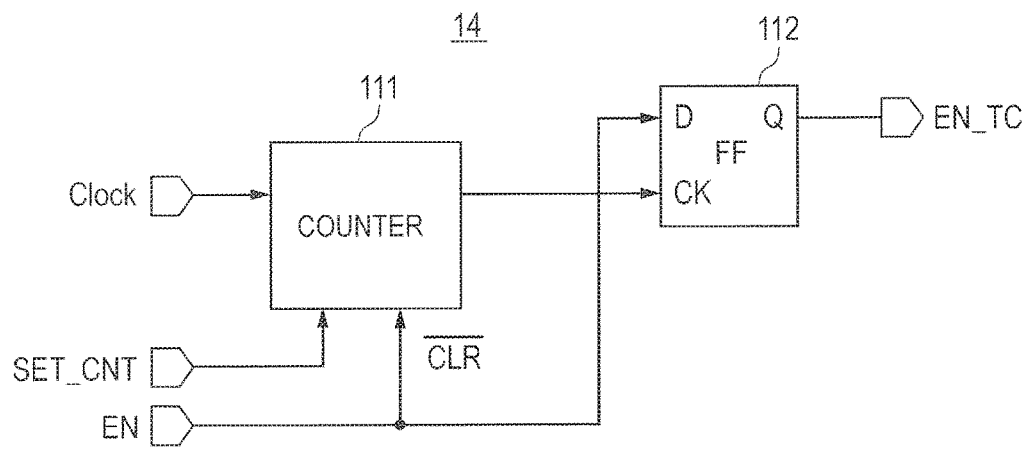
FIG. 5 is a block diagram showing a configuration of a timing generation circuit shown in FIG. 2.

The timing generation circuit shown in FIG. 2 is now described with reference to FIG. 5. FIG. 5 is a block diagram showing a configuration of the timing generation circuit shown in FIG. 2. The timing generation circuit 14 includes a counter 111 and a D flip-flop 112. When the first enable signal (EN) is L, the counter 111 is cleared, L is input to a D terminal of the D flip-flop (FF) 112, and the output signal (EN_TC) becomes L.

When the first enable signal (EN) becomes H, the counter 111 starts to operate, and outputs H after counting clock signals (Clock) up to a number set according to a counter set value (SET_CONT). Because H is input to the D terminal of the D flip-flop 112, the second enable signal (EN_TC) becomes H. Thus, the second enable signal (EN_TC) becomes H a predetermined period after the first enable signal (EN) becomes H. By setting the timing of outputting H of the second enable signal (EN_TC) at an appropriate value, it is possible to remove steps of variation of the output voltage (Vout) from the second regulator 2 to make it smooth. The counter set value (SET_CONT) and the clock signal (Clock) are supplied from the MCU 6.

Figure 6:
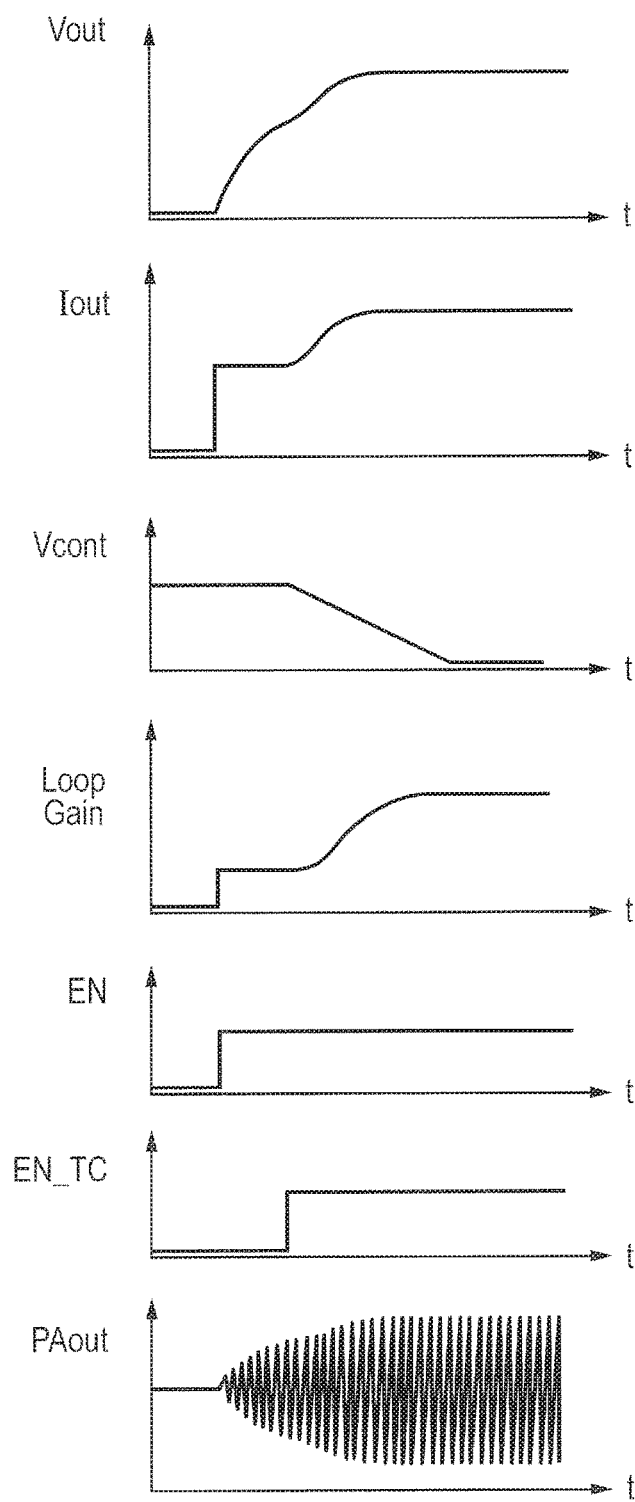
FIG. 6 is a waveform diagram indicative of operations of each signal from the second regulator shown in FIG. 2.

An operational waveform of each signal from the second regulator is now described with reference to FIG. 6. FIG. 6 is a waveform diagram indicative of operations of each signal from the second regulator shown in FIG. 2. When the enable signal (EN) is L, the output from the operational amplifier 10 becomes H, the PMOS transistor 12 is turned OFF, and the output voltage (Vout) from the second regulator 2 becomes 0 V. When the enable signal (EN) becomes H, the operational amplifier 10 starts to operate and the output current (Iout) is output. At this time, the loop gain control voltage (Vcont) of the loop gain control voltage generation circuit 13 is controlled so that the loop gain (Loop Gain) of the second regulator 2 takes a small value. In the implementation shown in FIG. 6, the output voltage (Vout) is made to be close to the power supply voltage (Vcc), but it is not limited thereto depending on the circuit system of the loop gain control circuit 11. In this manner, the output current (Iout) is limited and the output voltage (Vout) slowly increases as the load capacitor CL is charged. The output power from the output (PAout) of the power amplifier 5 also increases accordingly.

As the output voltage (Vout) increases, the load current (Ipa) flowing into the power amplifier 5 increases, and therefore the current (Ic) charged into the load capacitor CL decreases gradually and the rise rate of the output voltage (Vout) slows down.

At a certain timing when the rise of the output voltage (Vout) starts to slow down, the output of the signal (EN_TC) that operates the loop gain control voltage generation circuit 13 from the timing generation circuit 14 becomes H, and the loop gain control voltage (Vcont) of the loop gain control voltage generation circuit 13 inputs a signal weakening at a certain gradient to the loop gain control circuit 11 in the operational amplifier 10. In this manner, by continuously increasing the loop gain (Loop Gain) of the second regulator 2 based on analog control, the output current (Iout) can be controlled to slowly increase, and thus the output voltage (Vout) continuously changes to converge to an expected value. The output current (Iout) converges to the load current (Ipa) of the power amplifier 5. This enables the output power from the output (PAout) of the power amplifier 5 to slowly increase to the expected value.

<First Modification>

Figure 7:
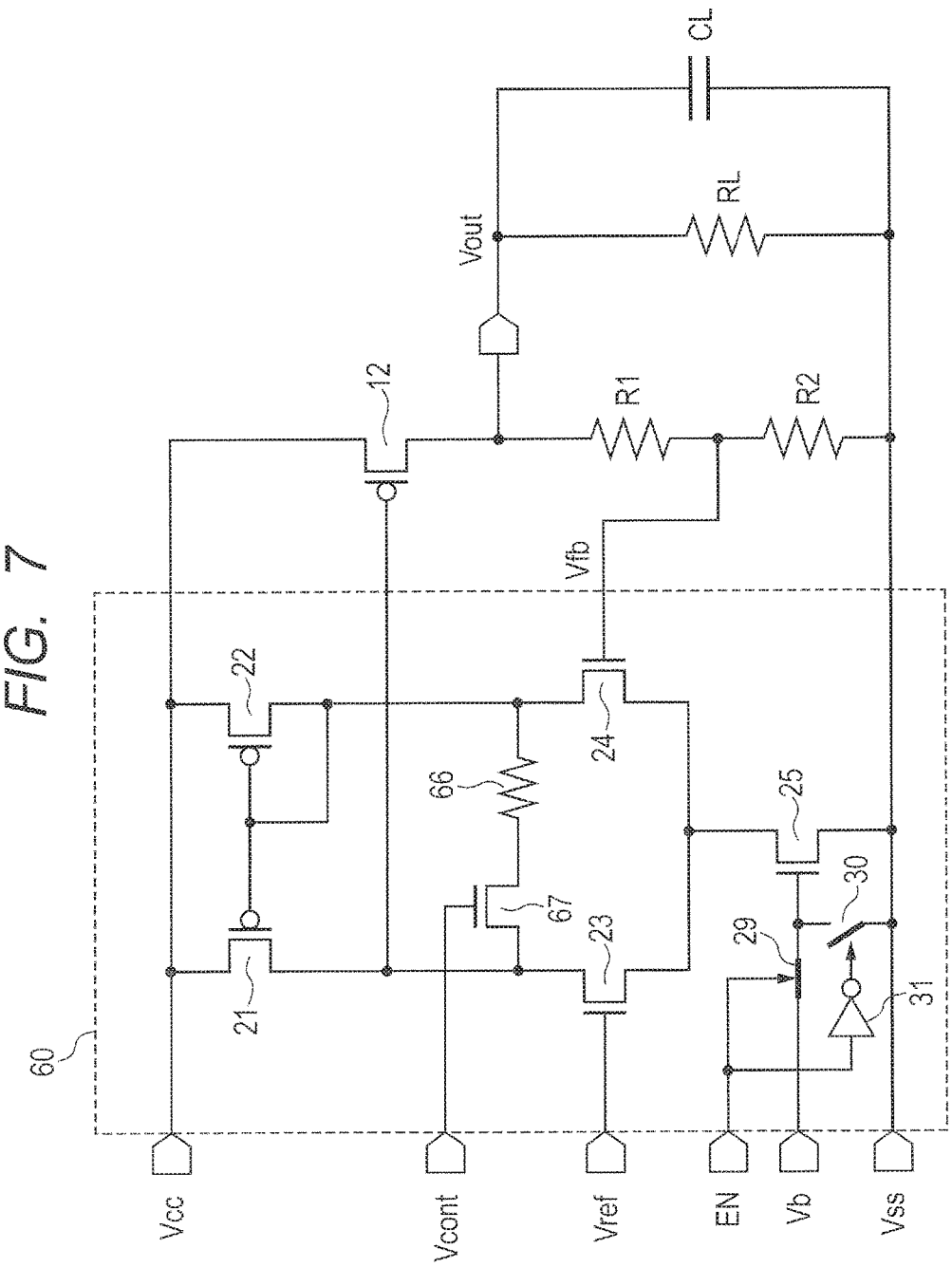
FIG. 7 is a circuit diagram showing an operational amplifier according to a first modification and its peripheral circuit.

A first modification of the operational amplifier according to the implementation is now described with reference to FIG. 7. FIG. 7 is a circuit diagram showing the operational amplifier according to the first modification and its peripheral circuit. In FIG. 7, the power amplifier 5 is indicated by an equivalent load resistor RL.

While the loop gain control circuit 11 includes the NMOS transistor 28 between the two resistors 26, 27 in the operational amplifier according to the implementation shown in FIG. 3, the two inter-differential resistors are integrated into a resistor 66 and an NMOS transistor 67 is included on the output side (the side of node N1) to the gate of the PMOS transistor 12 for adjusting the output of the second regulator 2 in the loop gain control circuit 11 of the operational amplifier 60 according to the first modification. Other configurations are similar to those of the implementation.

This hides an effect on the differential pair NMOS transistor 24 by parasitic capacitance of the NMOS transistor 67, and the parasitic capacitance of the NMOS transistor 67 coupled to the differential pair NMOS transistor 23 can be easily designed to ensure a phase margin of the second regulator by compensating the phase by the load capacitor CL along with the gate capacitance of the PMOS transistor 12.

<Second Modification>

Figure 8:
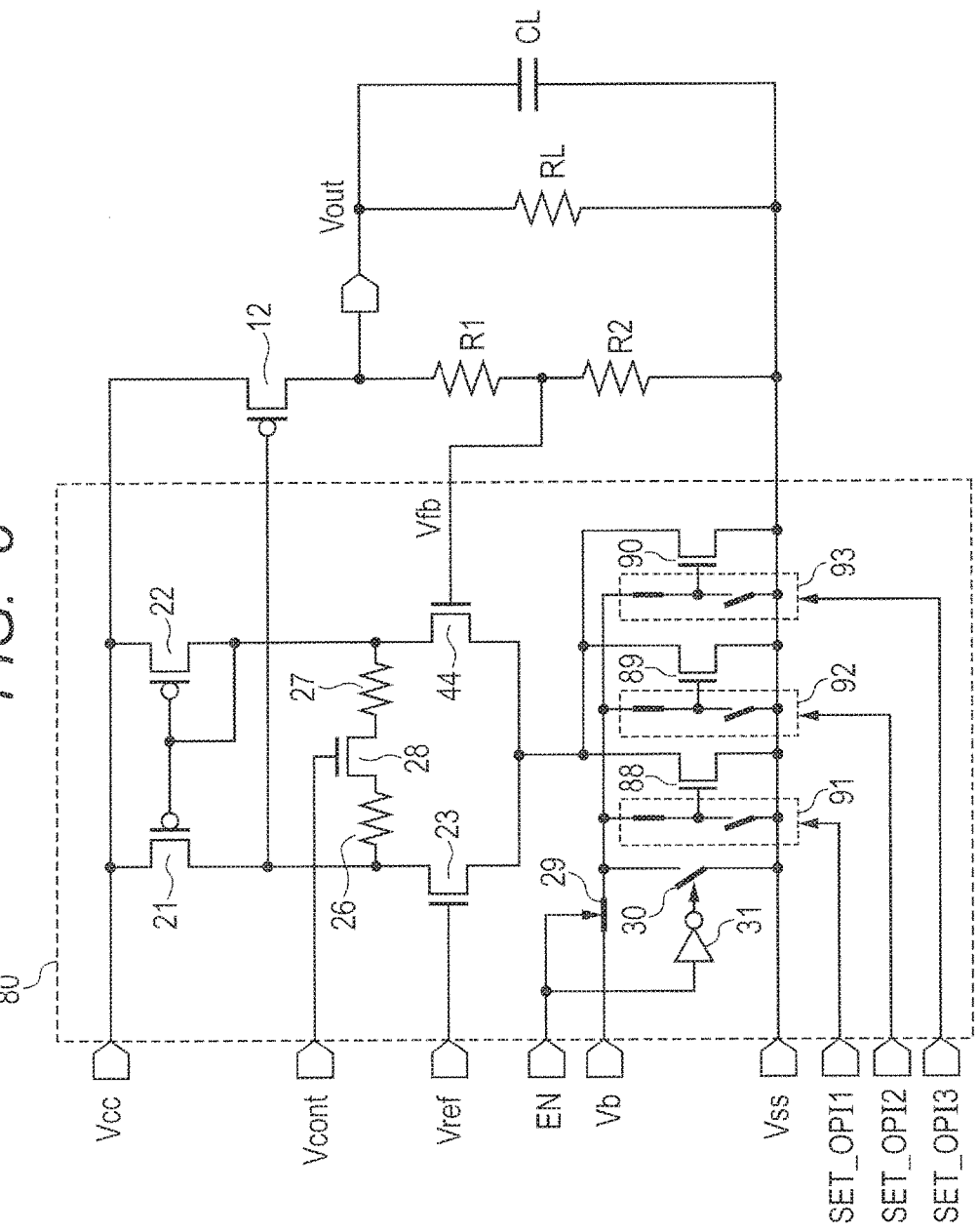
FIG. 8 is a circuit diagram showing an operational amplifier according to a second modification and its peripheral circuit.

A second modification of the operational amplifier according to the implementation is now described with reference to FIG. 8. FIG. 8 is a circuit diagram showing the operational amplifier according to the second modification and its peripheral circuit. In FIG. 8, the power amplifier 5 is indicated by the equivalent load resistor RL.

While the operational amplifier according to the implementation shown in FIG. 3 includes only one tail current source, an operational amplifier 80 according to the second modification includes a plurality of tail current sources, and the operating current of the operational amplifier 80 is adjusted by selecting a current source turned ON by SW. Other configurations are similar to those of the implementation. When there are provided n stages of the current sources, the adjustment can be made as finely as one to (2n−1) times of the reference current by weighting each current source two times. FIG. 8 shows an example that includes three stages of NMOS transistors 88, 89, 90 as the tail current source. By switching SW 91, 92, 93 based on the operating current set values (SET_OPI1 to 3), the operating current of the operational amplifier 80 can be switched in seven levels. The operating current set values (SET_OPI1 to 3) are supplied from the MCU 6. Each of SW 91, 92, 93 is configured by two SWs operating complementarily, and each SW may be configured by, for example, a transfer gate to which a NMOS transistor and a PMOS transistor are coupled in parallel. The loop gain control circuit of the operational amplifier 60 is similar to that in the implementation, but it may also be similar to that in the first modification.

By varying the operating current of the operational amplifier, the loop gain of the second regulator 2 can be varied when the loop gain control voltage (Vcont) is H. This makes it possible to correct variation of the loop gain of the second regulator 2 due to variation of the semiconductor manufacturing processes or the like. Thus, it is possible to adjust the gradient of the rise of the output voltage (Vout) from the second regulator 2.

<Third Modification>

Figure 9:
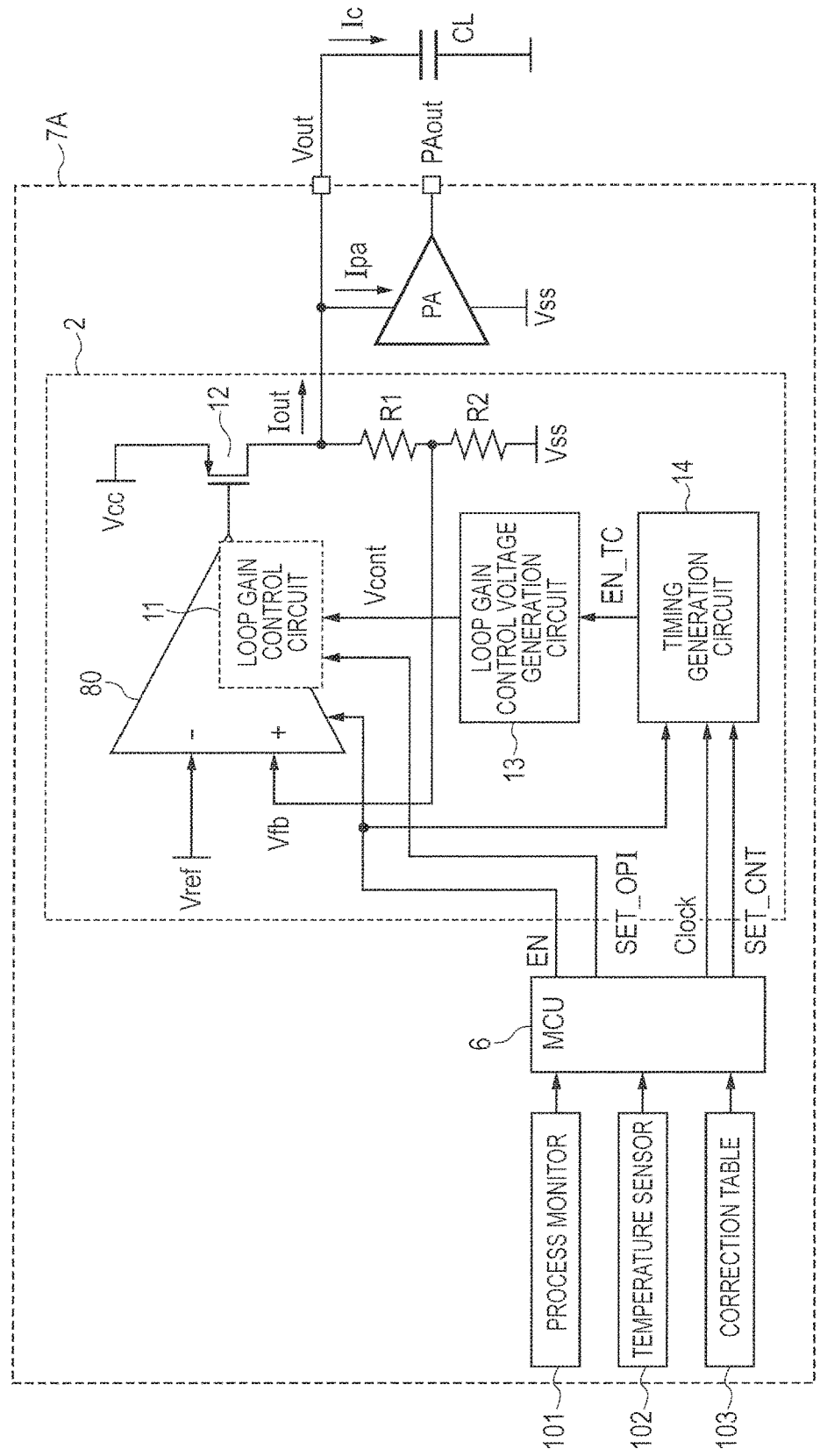
FIG. 9 is a block diagram showing a configuration of a wireless unit according to a third modification.

A modification of the wireless unit according to the implementation is now described with reference to FIG. 9. FIG. 9 is a block diagram showing a configuration of a wireless unit according to a third modification. The wireless unit 7A that is the semiconductor device according to the third modification corrects the gradient of the rising voltage of the second regulator 2 caused by the process variation or the temperature fluctuation. Thus, the wireless unit 7A includes, in addition to the components of the wireless unit 7, a process monitor 101, a temperature sensor 102, and a correction table 103 that stores therein a counter value of the timing generation circuit 14 (counter set value (SET_CNT)) and a set value of the operating current of the operational amplifier 80 (operating current set value (SET_OPI)), over a single semiconductor chip. The process monitor 101, the temperature sensor 102, and the correction table 103 are included in the first circuit block A as in the implementation. The process monitor 101 is a circuit that generates information based on the process variation of the semiconductor chip of the wireless unit 7A. The temperature sensor 102 is a circuit that generates temperature information of the semiconductor chip of the wireless unit 7A. The MCU 6 serving as the control circuit calculates information for setting the counter value of the timing generation circuit 14 and controlling the operating current of the operational amplifier 80 based on the information from the process monitor 101 and the information from the temperature sensor 102, and stores the information in the correction table 103. The correction table 103 is stored in a memory external to the MCU 6 or a memory inside the MCU 6.

A timing optimal to output from the timing generation circuit 14 a signal (EN_TC) for operating the loop gain control voltage generation circuit 13 and an optimal operating current for the operational amplifier may vary depending on the process, the temperature fluctuation, the load current of the power amplifier, and the like. Therefore, information including the optimal counter set value (SET_CNT) and the operating current set value (SET_OPI) is stored in the correction table 103 with respect to each condition described above. When starting up the second regulator 2, the MCU 6 reads the counter set value (SET_CNT) and the operating current set value (SET_OPI) of the operational amplifier 80 from the correction table 103, and outputs them to the timing generation circuit 14 and the operational amplifier 80. This makes it possible to correct the gradient of the rising voltage of the second regulator 2. It is also possible to use a calculation formula instead of the correction table 103.

The present specification includes at least the following configurations according to the embodiment.

The semiconductor device (7) in the first configuration includes the transmission circuit (3), the power amplifier (5), and the second regulator (2) that supplies power to the power amplifier. The second regulator (2) includes the operational amplifier (10) having the loop gain control circuit (11), the loop gain control voltage generation circuit (12), and the timing generation circuit (14), and minimizes the loop gain of the operational amplifier (10) when starting up the second regulator (2). This makes it possible to limit the inrush current, control the output power from the power amplifier, and make the change of the envelope at the time of starting up the power amplifier gentler, thereby suppressing the spurious wave caused in the near band of the output frequency.

The semiconductor device in the second configuration is similar to the first configuration except that the loop gain control circuit (11) of the operational amplifier (10) includes the inter-differential-output resistors (26, 27) of the operational amplifier and the NMOS transistor (28) that adjusts the resistance value between the differentials to continuously adjust the ON resistance of the NMOS transistor (28). This makes it possible to continuously control the loop gain of the regulator.

The semiconductor device in the third configuration is similar to the first configuration except that the loop gain control circuit (11) of the operational amplifier (10) includes the inter-differential-output resistor (66) of the operational amplifier and the NMOS transistor (67) that adjusts the resistance value between the differentials to continuously adjust the ON resistance of the NMOS transistor (67). This makes it possible to continuously control the loop gain of the regulator.

The semiconductor device in the fourth configuration is similar to the second or third configuration except that the operational amplifier (10) includes a plurality of tail current sources and selects a current source to be turned ON by a plurality of SWs (91 to 93), thereby adjusting the operating current of the operational amplifier. This makes it possible to adjust the gradient of the rise of the output voltage from the regulator.

The semiconductor device in the fifth configuration is similar to the fourth configuration except that it further includes the MCU (6), the process monitor (101), the temperature sensor (102), and the correction table (103). This makes it possible to adjust the counter setting value of the timing generation circuit (14) and the operating current set value of the operational amplifier in the loop gain control voltage generation circuit to the optimal value.

The invention made by the inventors is described above based on the embodiments, the implementations, and the modifications. It is needless to mention, however, that the invention is not limited to the embodiments, the implementations, and the modifications described above but various modifications can be made thereto.

For example, while the first regulator 1, the first block A including the transmission circuit 3, the second regulator 2, and the second circuit block B including the power amplifier 5 are configured over a single semiconductor chip in the implementation, the first regulator 1 and the first circuit block A may be configured over a semiconductor chip separate from that of the second regulator 2 and the second circuit block B. Furthermore, the first regulator 1, the first circuit block A, the second regulator 2, and the second circuit block B may be configured over four separate semiconductor chips, respectively.

What is claimed is:

1. A semiconductor device comprising:
a power amplifier that amplifies an output from a transmission circuit; and
a regulator that supplies power to the power amplifier, wherein the regulator comprises:
an operational amplifier comprising a loop gain control circuit; and
a loop gain control voltage generation circuit that supplies control voltage to the loop gain control circuit, and
wherein, when starting up the regulator, the loop gain control voltage generation circuit suppresses a loop gain of the operational amplifier to be lower than after starting up.

2. The semiconductor device according to claim 1, wherein the operational amplifier comprises:
first and second PMOS transistors that configure an active load in a current mirror;
first and second NMOS transistors that configure a differential pair;
a third NMOS transistor that is coupled to the first and second NMOS transistors and configures a current source; and
the loop gain control circuit coupled between a first node to which the first PMOS transistor and the first NMOS transistor are coupled and a second node to which the second PMOS transistor and the second NMOS transistor are coupled,
wherein the loop gain control circuit comprises:
a resistor provided between the first node and the second node; and
a fourth NMOS transistor that adjusts a resistance value of the resistor, and
continuously adjusts an ON resistance of the fourth NMOS transistor based on the control voltage.

3. The semiconductor device according to claim 1, wherein the operational amplifier comprises:
first and second PMOS transistors that configure an active load in a current mirror;
first and second NMOS transistors that configure a differential pair;
a plurality of current sources coupled to the first and second transistors;
a switch that selects at least one of the current sources; and the loop gain control circuit coupled between a first node to which the first PMOS transistor and the first NMOS transistor are coupled and a second node to which the second PMOS transistor and the second NMOS transistor are coupled,
wherein the loop gain control circuit comprises:
a resistor provided between the first node and the second node; and
a fourth NMOS transistor that adjusts a resistance value of the resistor, and
continuously adjusts an ON resistance of the fourth NMOS transistor based on the control voltage.

4. The semiconductor device according to claim 2,
wherein the resistor is coupled between the second node and the fourth NMOS transistor,
wherein the fourth NMOS transistor is coupled between the first node and the resistor, and
wherein an output of the operational amplifier is taken out of the first node.

5. The semiconductor device according to claim 2,
wherein the loop gain control voltage generation circuit:
supplies a predetermined control voltage to a gate of the fourth NMOS transistor for a predetermined period from the start of output from the regulator, and
supplies the control voltage lowering over time to the gate of the fourth NMOS transistor after the predetermined period.

6. The semiconductor device according to claim 5,
wherein the regulator further comprises a timing generation circuit, and
wherein the timing generation circuit comprises a counter and generates the predetermined period based on a set value of the counter.

7. The semiconductor device according to claim 6, further comprising:
a control circuit that controls the regulator;
a process monitor that detects process variation information of the semiconductor device;
a temperature sensor that detects temperature of the semiconductor device; and
a correction table that stores therein information calculated based on the information from the process monitor and the temperature sensor,
wherein the information stored in the correction table is information about the set value of the counter or which one of the switches should be selected, and
wherein the control circuit supplies the information stored in the correction table to the regulator.

8. A semiconductor device comprising, on a single semiconductor chip:
a first circuit block comprising a transmission circuit and a control circuit;
a first regulator that supplies power supply voltage to the first circuit block;
a second circuit block comprising a power amplifier; and
a second regulator that supplies the power supply voltage to the second circuit block,
wherein the second regulator comprises an operational amplifier comprising a loop gain control circuit and, when starting up the second regulator, suppresses a loop gain of the operational amplifier to be lower than after starting up, based on a control signal from the control circuit.

9. The semiconductor device according to claim 8,
wherein the semiconductor device according to claim 8 further comprising:
a loop gain control voltage generation circuit that supplies control voltage to the loop gain control circuit; and
a timing generation circuit that controls the timing of generating the control voltage by the loop gain control voltage generation circuit, and
wherein the control circuit controls the operational amplifier and the timing generation circuit.

10. The semiconductor device according to claim 9,
wherein the loop gain control voltage generation circuit:
supplies a predetermined control voltage to the loop gain control circuit for a predetermined period from the start of output from the second regulator, and
supplies the control voltage lowering over time to the loop gain control circuit after the predetermined period.

11. The semiconductor device according to claim 10,
wherein the timing generation circuit comprises a counter, and generates the predetermined period based on a value of the counter set by the control circuit.

12. The semiconductor device according to claim 11,
wherein the operational amplifier comprises:
first and second PMOS transistors that configure an active load in a current mirror;
first and second NMOS transistors that configure a differential pair;
a third NMOS transistor that is coupled to the first and second NMOS transistors and configures a current source; and
the loop gain control circuit coupled between a first node to which the first PMOS transistor and the first NMOS transistor are coupled and a second node to which the second PMOS transistor and the second NMOS transistor are coupled, and
wherein the loop gain control circuit comprises:
a resistor provided between the first node and the second node; and
a fourth NMOS transistor that adjusts a resistance value of the resistor, and
continuously adjusts an ON resistance of the fourth NMOS transistor based on the control voltage.

13. The semiconductor device according to claim 11,
wherein the operational amplifier comprises:
first and second PMOS transistors that configure an active load in a current mirror;
first and second NMOS transistors that configure a differential pair;
a plurality of current sources coupled to the first and second transistors;
a switch that selects at least one of the current sources; and
the loop gain control circuit coupled between a first node to which the first PMOS transistor and the first NMOS transistor are coupled and a second node to which the second PMOS transistor and the second NMOS transistor are coupled,
wherein the loop gain control circuit comprises:
a resistor provided between the first node and the second node; and
a fourth NMOS transistor that adjusts a resistance value of the resistor,
adjusts an operating current of the operational amplifier based on the selection made by the switches, and
continuously adjusts an ON resistance of the fourth NMOS transistor based on the control voltage.

14. The semiconductor device according to claim 12,
wherein the resistor is coupled between the second node and the fourth NMOS transistor, wherein the fourth NMOS transistor is coupled between the first node and the resistor, and wherein an output of the operational amplifier is taken out of the first node.

15. The semiconductor device according to claim 11, wherein the first circuit block comprises:

a process monitor that detects process variation information of the semiconductor device;

a temperature sensor that detects temperature of the semiconductor device; and a correction table that stores therein information calculated based on the information from the process monitor and the temperature sensor, wherein the information stored in the correction table is information about the set value of the counter or which one of the switches should be selected, and wherein the control circuit supplies the information stored in the correction table to the second regulator.

16. The semiconductor device according to claim 3, wherein the resistor is coupled between the second node and the fourth NMOS transistor, wherein the fourth NMOS transistor is coupled between the first node and the resistor, and wherein an output of the operational amplifier is taken out of the first node.

17. The semiconductor device according to claim 3, wherein the loop gain control voltage generation circuit:

supplies a predetermined control voltage to a gate of the fourth NMOS transistor for a predetermined period from the start of output from the regulator, and supplies the control voltage lowering over time to the gate of the fourth NMOS transistor after the predetermined period.

18. The semiconductor device according to claim 17, wherein the regulator further comprises a timing generation circuit, and wherein the timing generation circuit comprises a counter and generates the predetermined period based on a set value of the counter.

19. The semiconductor device according to claim 18, further comprising:

a control circuit that controls the regulator;

a process monitor that detects process variation information of the semiconductor device;

a temperature sensor that detects temperature of the semiconductor device; and a correction table that stores therein information calculated based on the information from the process monitor and the temperature sensor, wherein the information stored in the correction table is information about the set value of the counter or which one of the switches should be selected, and wherein the control circuit supplies the information stored in the correction table to the regulator.

20. The semiconductor device according to claim 13, wherein the resistor is coupled between the second node and the fourth NMOS transistor, wherein the fourth NMOS transistor is coupled between the first node and the resistor, and wherein an output of the operational amplifier is taken out of the first node.

* * * * *